United States Patent [19]
Watanabe et al.

[11] Patent Number: 5,621,326
[45] Date of Patent: Apr. 15, 1997

[54] FAULT DIAGNOSIS DEVICE FOR PASSENGER PROTECTION APPARATUS

[75] Inventors: Makoto Watanabe, Nissin; Yukiyasu Ueno, Nishio, both of Japan

[73] Assignee: Nippondenso Co., Ltd., Kariya, Japan

[21] Appl. No.: 460,523

[22] Filed: Jun. 2, 1995

[30] Foreign Application Priority Data

Jun. 3, 1994 [JP] Japan ................................. 6-145489

[51] Int. Cl.6 ................................................. B60R 21/32
[52] U.S. Cl. ........................... 324/502; 324/550; 280/735
[58] Field of Search .................... 307/10.1, 41; 340/436, 340/438; 280/735; 324/502, 550, 718, 503

[56] References Cited

U.S. PATENT DOCUMENTS

| | | |
|---|---|---|
| 4,287,431 | 9/1981 | Yasui et al. |
| 4,835,513 | 5/1989 | McCurdy ................................ 340/438 |
| 4,893,109 | 1/1990 | Vrabel ..................................... 340/438 |
| 4,956,631 | 9/1990 | Itoh ......................................... 340/438 |
| 4,990,884 | 2/1991 | McCurdy ................................ 340/438 |
| 5,268,643 | 12/1993 | Aso et al. |

FOREIGN PATENT DOCUMENTS 6-24289  2/1994  Japan .

Primary Examiner—Kenneth A. Wieder
Assistant Examiner—Jose M. Solis
Attorney, Agent, or Firm—Cushman, Darby & Cushman IP Group of Pillsbury Madison & Sutro LLP

[57] ABSTRACT

A passenger protection apparatus is provided with a plurality of squibs (activating elements). Transistors are respectively connected in series to these squibs. By switching on these transistors at predetermined differing timing, first monitor currents are conducted via current-controlling resistors to the respective squibs. First monitor currents can be independently conducted to the respective squibs with this structure. For this reason, the voltage levels generated at the squibs by the first monitor currents can be enlarged. Resistance values of the respective squibs can be calculated with high accuracy from these voltage values.

6 Claims, 3 Drawing Sheets

FAULT DIAGNOSIS DEVICE FOR PASSENGER PROTECTION APPARATUS

CROSS REFERENCE TO RELATED APPLICATION

This application is based upon and claims priority from Japanese Patent Application No. Hei. 6-145489 filed Jun. 3, 1994, the contents of which are incorporated herein by reference.

BACKGROUND OF THE INVENTION

1. Field of the Invention

The present invention relates to a fault diagnosis device applied in a passenger protection apparatus of an airbag apparatus for vehicle use, a seatbelt pretensioner, or the like, and more particularly, to a fault diagnosis device applied in a passenger protection apparatus provided with a plurality of activating elements to activate the passenger protection apparatus.

2. Related Art

Conventionally, a passenger protection apparatus for vehicle use detects acceleration of the vehicle with a sensor and detects collision of the vehicle on the basis of the detected acceleration. At the time of vehicle collision detection, the passenger protection apparatus is caused to be activated to protect a passenger. Because the passenger protection apparatus must operate reliably at the time of vehicle collision, it is normally provided with a self-diagnosis device so as to be able to inspect for the presence or absence of an abnormality in various areas of the apparatus. With regard to the activating element, which is the most critical structural portion, the presence or absence of an abnormality is determined by measuring whether a resistance value of the activating element is normal, as in, for example, Japanese Patent Application Laid-open No. 4-28779. In addition, inspection of other aspect is executed and the presence or absence of respective abnormalities is determined.

Normally, a minute monitor current passes through to the activating element. A resistance value is calculated from the voltage values generated at the activating element during conductance of the monitor current, and the presence or absence of abnormality is determined. In a case where this passenger protection apparatus exists for example at a driver's seat and a passenger seat, a plurality of activating elements are disposed. In this case, the respective activating elements are inspected to confirm that the respective activating elements operate normally.

Because of the constitution of the activating elements, a large monitor current cannot be caused to flow. Moreover, because a resistance value of the activating element is normally low (approximately 2.2 Ohms), the voltage value produced by the monitor current is extremely small. For these reasons, an operational amplifier (op-amp) is utilized to amplify the voltage value. However, the voltage value amplified by the op-amp includes an error due to an offset voltage in the op-amp. To remove the offset voltage included in the voltage value, two types of monitor currents are delivered to the activating element and causes two types of voltage values to be generated. Because the two types of voltage values include the same error, the error can be removed by subtracting one voltage value from the other voltage, as is disclosed in Japanese Patent Application Laid-open No. 6-24289. Accordingly, the resistance value of the activating element is determined from the voltage value from which the offset voltage has been removed.

However, in a passenger protection apparatus having a plurality of activating elements, it is impossible for the activating elements to operate independently, and so in many cases a plurality of activating elements are connected in parallel with respect to a control circuit. In a case where activating elements are connected in parallel, the monitor current passes simultaneously through the activating elements at a time of fault diagnosis. For this reason, the monitor current is divided and conducted to the respective activating elements. As a result, the voltage value due to the monitor current becomes increasingly smaller. Additionally, if the activating elements are connected in parallel, there is a chance that the monitor current will become uncertain with respect to each activating element. In addition, there is also a chance that an abnormality in one activating element will affect the monitor voltage value of other activating elements. Consequently, it is not preferable simply to connect activating elements in parallel.

SUMMARY OF THE INVENTION

It is an object of the present invention to provide a fault diagnosis device capable of accurately performing abnormality detection fault diagnosis of an activating element even in a case where a passenger protection apparatus has a plurality of activating elements.

It is a further object of the present invention to simplify a structure of a fault diagnosis device.

To solve the foregoing problem, a fault diagnosis device for passenger protection apparatus according to the present invention, which detects the presence or absence of a failure of the activating element which operates in correspondence to acceleration of a vehicle to activate a passenger protection apparatus, comprises a plurality of activating elements connected in parallel with respect to a power source, a plurality of switching devices connected in series with respect to the respective activating elements to cause current to be conducted individually to the respective activating elements, a conductance controlling device to cause conductance to the plurality of switching devices with differing timings, and determination means for determining the presence or absence of a fault in the plurality of activating elements by respectively detecting voltage values generated at the activating elements and comparing the detected voltage value with a predetermined standard value when monitor current is conducted to the respective activating elements by the conductance controlling device.

It is preferred that the plurality of switching devices perform conductance of the monitor current to the activating elements and conductance of the activating current to the plurality of activating elements on the basis of an acceleration signal from an acceleration sensor to detect acceleration of the vehicle.

Furthermore, it is also acceptable to connect an acceleration switch which closes its contact and applies power-source voltage to the plurality of activating element when acceleration equivalent to vehicle collision has been generated and a diode forward-biased in the direction from the acceleration switch to the activating elements between the acceleration switch and the activating elements, and connect a plurality of resistors in parallel with the acceleration switch and the diode and in series respectively with the activating elements.

Moreover, a predetermined second monitor current is conducted to the activating elements via a current-limiting resistor when the switching device is off, and the determination means is also capable of determining the presence or absence of a fault of the activating elements on the basis of a differential voltage of a second voltage value of the activating elements generated by the second monitor current and the voltage value generated by the monitor current.

According to the present invention, monitor current can be conducted individually with respect to the plurality of activating elements by the plurality of switching devices. Because monitor current is conducted independently with respect to the respective activating elements, a monitor current flows with respect to one activating element, and a level of voltage value can be made large in comparison with a case of simultaneous conductance. The monitor voltages of the respective activating elements are detected, and the resistance values of the respective activating elements can be determined accurately from the voltage values thereof. The presence or absence of abnormality is determined by comparing these resistance values with a normal standard value. Additionally, the switching devices which cause monitor current to flow can, together with the acceleration switch, perform conductance of activating current to the activating elements when acceleration equivalent to vehicle collision has been generated. In this case, circuit structure can be simplified. By inserting a diode into the path along which monitor current is conducted, then even if an activating element of another system is abnormal (for example a broken lead or a short circuit), influence thereof can be eliminated.

Additionally, when the switching device is off, a second monitor current is caused to flow with respect to the plurality of activating elements via a current-limiting resistor. Moreover, when the switching device is on, monitor current is caused to be conducted to the respective activating elements. Accordingly, a first voltage value and second voltage value due to the two types of monitor currents generated at the respective activating elements are measured. The first and second voltage values are the voltage values generated at the activating element measured in a case where the respective monitor current and second monitor current have been caused to flow to a specified activating element. Accordingly, the resistance values of the respective activating elements are calculated and determined from the differential of the first and second voltage values, and abnormality of the activating elements is diagnosed. In this way, error included in the first and second voltage values can be eliminated.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENTS

A specific embodiment according to the present invention will be described hereinafter.

Figure 1:
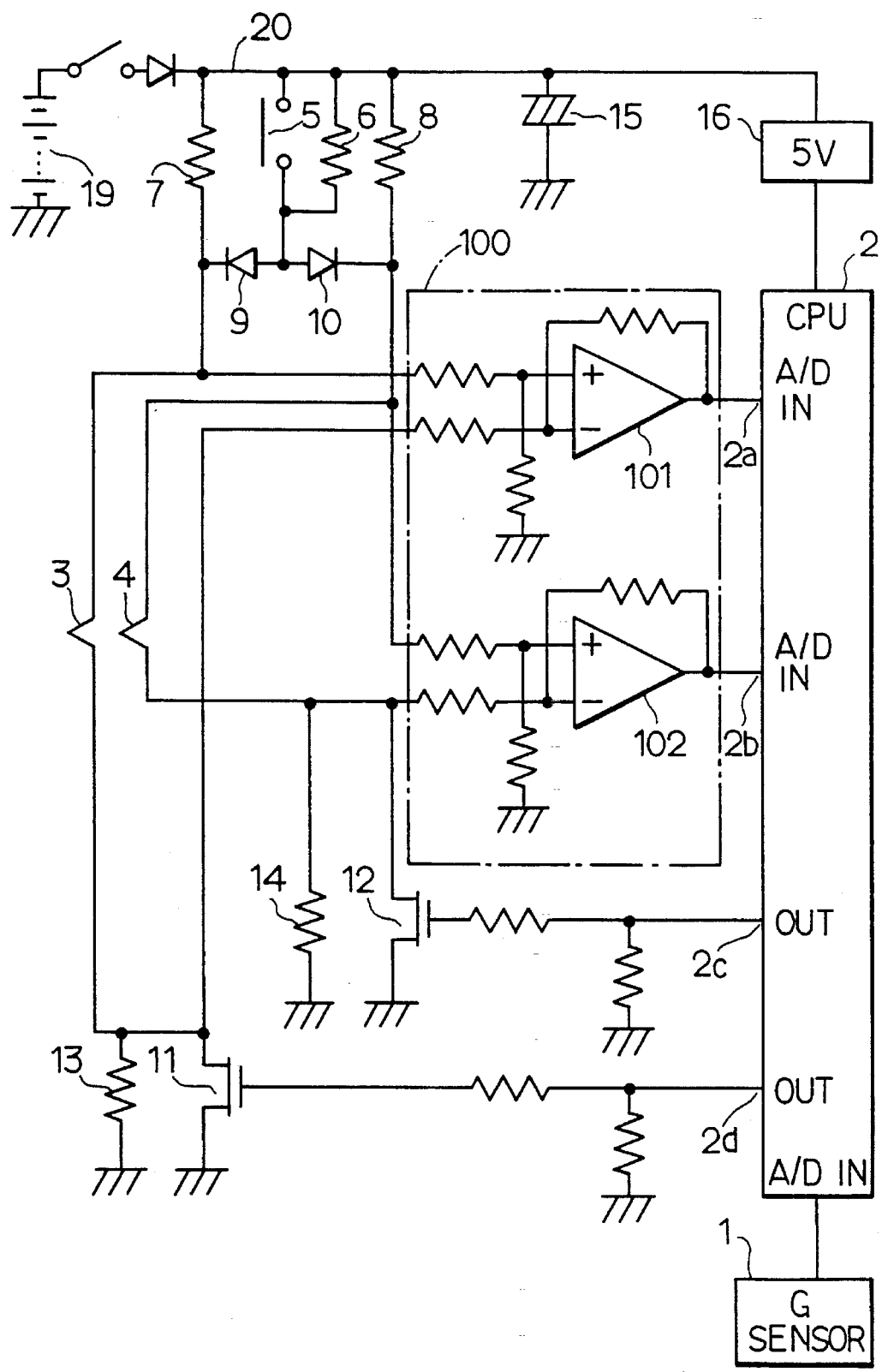
FIG. 1 is a circuit diagram illustrating a control circuit of a passenger protection apparatus including a fault diagnosis device for passenger protection apparatus use according to the present invention.

FIG. 1 is a circuit diagram illustrating a control circuit of a passenger protection apparatus (airbag apparatus) for vehicle use according to a first embodiment of the present invention. This airbag apparatus is provided with a plurality of squibs 3 and 4 (for example, for a driver seat and a passenger seat) which are activating elements to cause an airbag (not illustrated) to be inflated when acceleration equivalent to vehicle collision is generated. This control circuit also doubles as a fault diagnosis device of the squibs, and is structured primarily of a G sensor 1, a processing unit (CPU) 2, a power source 19, a differential amplifier portion 100, and so on. A 5 V power source 16 for CPU use and a capacitor 15 which becomes an auxiliary power source during conductance of activating current to the squibs 3 and 4 are connected on a power-source line (12 V) 20.

To the plurality of squibs 3 and 4 are connected an acceleration switch 5 and diodes 9 and 10 on the power-source side, and transistors 11 and 12 on the ground side. The squibs 3 and 4 which are activating elements are activated by this acceleration switch 5 and transistors 11 and 12 switching on simultaneously. The passenger protection apparatus is operated by this activation of the squibs 3 and 4, generating a large amount of gas and expanding the airbag.

A resistor 6 is connected in parallel with the acceleration switch 5. Resistors 7 and 8 which are current-limiting resistors are connected respectively between the power-source line 20 and the squibs 3 and 4. Resistors 13 and 14 which are current-limiting resistors are connected respectively in parallel with the transistors 11 and 12 on the ground side of the squibs 3 and 4 as well. Normally, a weak current as a second monitor current respectively flows to the squibs 3 and 4 through these resistors 7, 8, 13, and 14. The resistance values of these resistors 7, 8, 13, and 14 are established so that the required second monitor current flows to the squibs 3 and 4. The respective internal resistance values of the squibs 3 and 4 are approximately 2 Ohms.

Transistors 11 and 12 are connected in parallel with the respective resistors 13 and 14 on the ground side of the squibs 3 and 4. The processing unit 2 which is a conductance-controlling device outputs control signals to switch these transistors 11 and 12, and the processing unit 2 controls conductance of the squibs 3 and 4 by means of the control signals. When these transistors 11 and 12 are switched on, current flowing to the squibs 3 and 4 flows via the transistors 11 and 12, and so the current flowing to the squibs 3 and 4 increases. This current is utilized as a monitor current (hereinafter "first monitor current") for fault diagnosis of the squibs 3 and 4. Additionally, the transistors 11 and 12 are also employed as conductance switches to actually cause the squibs to be activated. That is, because the acceleration switch 5 is switched on by acceleration generated during vehicle collision, a large current to activate the squibs 3 and 4 flows by causing the transistors 11 and 12 to switch on based on an acceleration signal from the G sensor 1 at that time.

Furthermore, respective input resistors connected to the input sides of respective differential amplifiers 101 and 102 of the differential amplifier portion 100 are made to have adequately large values compared with the resistors 7, 8, 13, and 14 structuring the circuit for causing current to flow to the squibs 3 and 4. Consequently, these resistors do not affect the first and second monitor current values conducted to the squibs 3 and 4.

Because the maximum current value which can be caused to flow as a monitor current is roughly 50 mA, the compound resistance value of the resistors 7 and 8 as well as 13 and 14 to limit the current value becomes a minimum of roughly 200 Ohms in a case where the power source is 12 V. When the transistors 11 and 12 are switched on, the first monitor current which is larger than the second monitor current flows, and so the respective resistance values are established so that this first monitor current becomes approximately 50 mA at a maximum. Needless to say, it is of course also acceptable to establish a current value as required by the other components.

In a case where acceleration equivalent to vehicle collision has occurred, firstly the mechanical acceleration switch 5 goes on. At this time, the power-source line 20 is connected directly with the squibs 3 and 4 via the diodes 9 and 10. Accordingly, the G sensor 1 detects the acceleration thereof and sends a signal to the processing unit (CPU) 2, and when the processing unit 2 determines that vehicle collision has occurred, the control signals are output to the transistors 11 and 12 connected to the respective squibs 3 and 4. The transistors 11 and 12 are each switched on simultaneously by this control signals. Large current flows to the squibs 3 and 4 and the airbag is expanded. Consequently, the transistors 11 and 12 which are switching devices also double as devices to cause activating current to flow to the squibs 3 and 4 at the time of vehicle collision.

Normally, the acceleration switch 5 remains off and a second monitor current flows to the respective squibs 3 and 4 by the resistors 7 and 13 and resistors 8 and 14 and the resistor 6. Additionally, the transistors 11 and 12 are switched on at a predetermined timing and the first monitor current flows to the squibs 3 and 4. The processing unit 2 detects, via the differential amplifier portion 100, the voltage values generated at the squibs 3 and 4 by the first and second monitor currents. Accordingly, the processing unit 2 employs these voltage values to perform fault diagnosis. The fault diagnosis thereof will be described in detail hereinafter with reference to the flowchart of FIG. 2.

Firstly, initialization of the processing unit 2 is performed (step 201). Accordingly, the voltage value (second voltage value) generated at the respective squibs 3 and 4 by the second monitor current are amplified by the differential amplifier portion 100, and outputs thereof are taken into the processing unit 2 from A/D inputs 2a and 2b (step 202). It is determined from the second voltage value whether the activating circuit which includes the squibs 3 and 4 is normal (step 203). In a case of abnormality, a light to inform the passenger of an abnormality is immediately illuminated in step 211, a record in written to memory within the processing unit 2, and inspection is repeated again.

In a case where the activating circuit is normal, output 2d of the processing unit 2 goes to "Hi" level to switch on the transistor 11 which controls conductance of the squib 3 (step 204). The current flowing to the squib 3 comes to pass through only the resistance of the resistors 7 and 6 and the squib 3 by the transistor 11 being switched on, and the first monitor current flows. The voltage value generated at the squib 3 in this case is amplified by the differential amplifier 101 of the differential amplifier portion 100, and the output thereof is input to the processing unit 2 via the A/D input 2a (step 205).

Subsequently, after the transistor 11 is first switched off with output 2d of the processing unit 2 at "Lo" level, the transistor 12 is then caused to switch on with output 2c of the processing unit 2 at "Hi" level. Because of this, the first monitor current flows to the squib 4 (step 206). Accordingly, similarly to the case of the squib 3, the voltage values at the squib 4 during conductance of the first monitor current are amplified by the differential amplifier 102. The output thereof is input to the processing unit 2 via the A/D input 2b (step 207). Thereafter, the transistor 12 is switched off with the output 2c of the processing unit 2 at "Lo" level (step 208).

Next, calculation of the resistance values $R_3$ and $R_4$ of the squibs 3 and 4 is performed by the processing unit 2. Taking the respective second monitor currents to be $I_3$ and $I_4$, the first monitor currents to be $I_3'$ and $I_4'$, the output voltage values due to the second monitor currents to be $V_3$ and $V_4$, and the output voltage values due to the first monitor currents to be $V_3'$ and $V_4'$, the resistance values $R_3$ and $R_4$ are determined from:

$$R_3 = V_3'/I_3' - V_3/I_3 \quad (1)$$

$$R_4 = V_4'/I_4' - V_4/I_4 \quad (2)$$

(step 209). As was described above, the resistance values of the squibs 3 and 4 are roughly 2 Ohms, which is small. In comparison with this, the resistance values of the resistors 7, 8, 13, and 14 are extremely large. Consequently, the respective monitor currents are essentially determined by the resistance values of the resistors 7, 8, 13, and 14 connected to the squibs 3 and 4. Additionally, the offset voltages of the differential amplifiers 101 and 102 of the differential amplifier portion 100 are contained to the same extent in the first and second voltage values obtained by the first and second monitor currents. For this reason, the difference in resistance values calculated from these voltage values is taken. The offset voltages can be canceled out by this processing, and resistance values $R_3$ and $R_4$ can be calculated with high accuracy.

The resistance values $R_3$ and $R_4$ obtained in this way are respectively compared with a standard value and determination of whether they are abnormal is made (step 210); if there is an abnormality, a warning light is immediately caused to illuminate (step 211), and if there is no abnormality inspection is performed again from the start without change.

Figure 2:
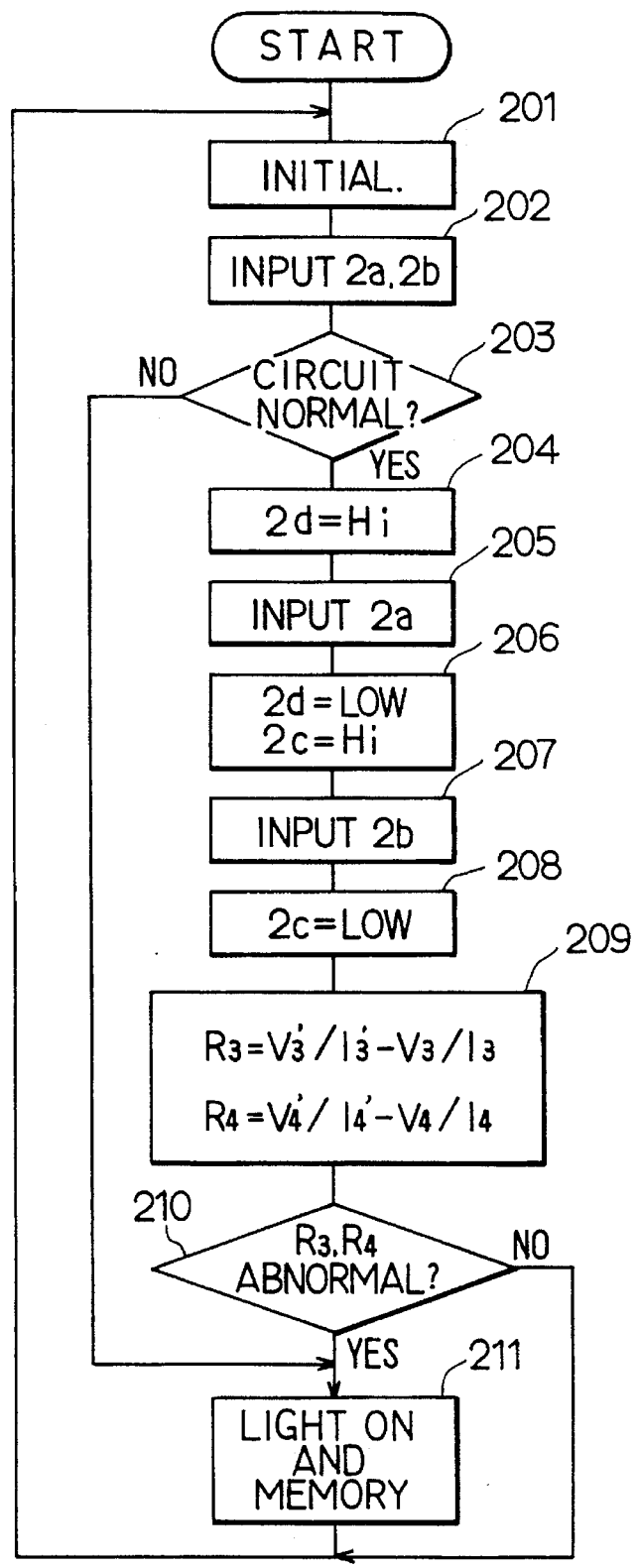
FIG. 2 is a flowchart illustrating operational processing as a first embodiment executed by the CPU of the circuit shown in FIG. 1.

In a case where acceleration equivalent to vehicle collision is generated during execution by the processing unit 2 of the processing shown in the flowchart of FIG. 2, the transistors 11 and 12 are immediately switched on by interrupt processing or the like. Because the switch 5 is already on at that time, the airbag is immediately expanded and no delay occurs as a passenger protection apparatus.

A second embodiment according to the present invention will be described hereinafter.

Figure 3:
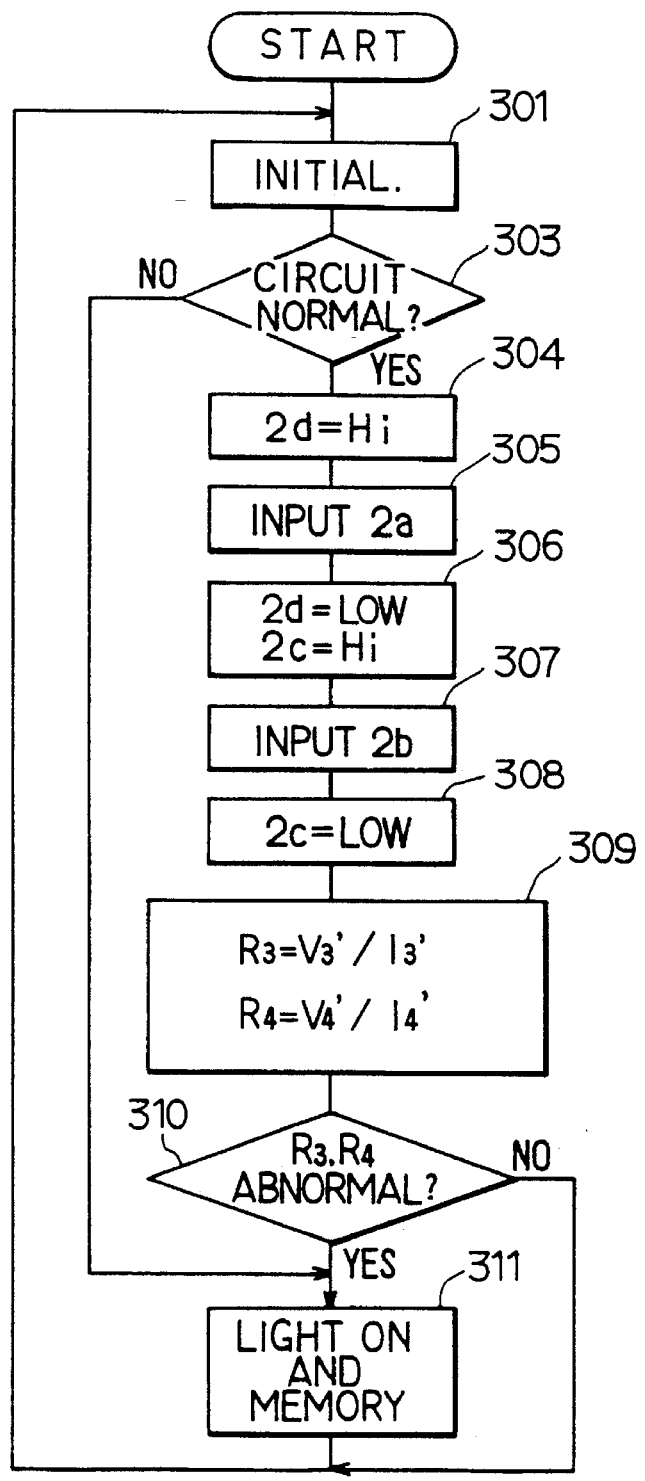
FIG. 3 is a flowchart illustrating operational processing as a second embodiment executed by the CPU of the circuit shown in FIG. 1.

According to the above-described embodiment, the second monitor current was measured in step 202, as shown in FIG. 2. As shown in the flowchart of FIG. 3, however, it is acceptable not to measure the second monitor current. In this case, as shown in step 307, calculation of the resistance values taking the first monitor currents to be respectively $I_3'$ and $I_4'$ is determined as:

$$R_3 = V_3'/I_3' \quad (3)$$

$$R_4 = V_4'/I_4'. \quad (4)$$

The circuit structure shown in FIG. 1 indicates that this can calculate the resistance values $R_3$ and $R_4$ with only the first monitor currents, without measuring the foregoing second monitor currents. Additionally, the processing of other steps (301 to 311, except 309) is identical with the respective steps of the corresponding FIG. 2.

It is also possible for the resistors 7, 8, 13, and 14 and diodes 9 and 10 in FIG. 1 to be absent and the acceleration switch 5 (and the parallel resistor 6 thereof) to be connected directly to the two squibs 3 and 4. In this case, however, if the squibs 3 and 4 are simultaneously caused to be electrified and monitor current is caused to flow, the current is limited by the resistor 6 and moreover the current is divided and flows to the two squibs 3 and 4. For this reason, there exists the disadvantage of the voltage becoming small.

What is claimed is:

1. A fault diagnosis device for a passenger protection apparatus which diagnoses a presence or absence of a failure of an activating element for activating said passenger protection apparatus in correspondence to acceleration of a vehicle, comprising:

a plurality of activating elements formed by resistors and connected in parallel with respect to a power source;

an acceleration switch which is disposed between said plurality of activating elements and said power source, which closes its contact in response to an occurrence of acceleration equivalent to vehicle collision;

a current limiting resistor connected in parallel with said acceleration switch;

a plurality of switching devices connected in series with respect to said respective activating elements to cause monitor current to be conducted individually to said respective activating elements through said current limiting resistor and to cause activating current, which causes said activating elements to activate said passenger protection apparatus, to be conducted to said respective activating elements through said acceleration switch when acceleration equivalent to vehicle collision has occurred;

a conductance controlling device which closes said plurality of switching devices with differing timings to generate the monitor current; and determination means for determining the presence or absence of the fault in said plurality of activating elements by respectively detecting voltage values generated at the activating elements and comparing the detected voltage values with a predetermined standard value when the monitor current is conducted to the respective activating elements by said conductance controlling device.

2. A fault diagnosis device for a passenger protection apparatus according to claim 1, wherein said current limiting resistor is formed from a plurality of resistors which are connected in series to said respective activating elements to limit the monitor current to a predetermined value, wherein said switching devices are disposed at an opposite side of said respective activating elements with respect to said plurality of resistors.

3. A fault diagnosis device for a passenger protection apparatus which diagnoses a presence or absence of a failure of an activating element for activating said passenger protection apparatus in correspondence to acceleration of a vehicle, comprising:

a plurality of activating elements formed by resistors and connected in parallel with respect to a power source;

a plurality of switching devices connected in series with respect to said respective activating elements to cause monitor current to be conducted individually to said respective activating elements;

an acceleration switch which is disposed between said plurality of activating elements and said power source, which has contacts to be closed in order to apply power-source voltage to said plurality of activating elements when acceleration equivalent to vehicle collision has been generated, and a resistor connected in parallel with said contacts;

a plurality of diodes respectively disposed between said resistor of said acceleration switch and said plurality of activating elements, and forward-biased in the direction from said resistor of said acceleration switch to said plurality of activating elements;

a plurality of limiting resistors connected in parallel with each of circuits formed of said acceleration switch and each of said plurality of diodes and in series respectively with said activating elements, which limit the monitor current to a predetermined value;

a conductance controlling device to close said plurality of switching devices with differing timings to generate the monitor current; and determination means for determining the presence or absence of the fault in said plurality of activating elements by respectively detecting voltage values generated at said activating elements and comparing the detected voltage values with a predetermined standard value when the monitor current is conducted to the respective activating elements by said conductance controlling device.

4. A fault diagnosis device for a passenger protection apparatus according to claim 3, further comprising:

current-limiting resistors connected in parallel respectively with said plurality of switching devices, which limit current flowing to said activating elements and cause a predetermined second monitor current to flow to said activating elements when said switching devices are off, wherein said determination means determines the presence or absence of a fault of said activating elements on the basis of respective differential voltages between second voltage values of said activating elements generated by said second monitor current and said voltage values generated by said monitor current.

5. A method of diagnosing a presence or absence of a failure of a plurality of activating elements formed by resistors for activating a passenger protection apparatus in correspondence to acceleration of a vehicle, comprising the steps of:

switching a plurality of switching devices on and off with differing timings, said plurality of switching devices connected in series with respect to said respective activating elements between said activating elements and a power source, and thereby causing monitor current to be conducted individually to said respective activating elements when said switching devices are respectively switched on;

amplifying respective voltage values generated at said activating elements by differential amplifiers provided corresponding to said plurality of activating elements when said respective monitor currents are conducted thereto;

amplifying second voltage values generated at said respective activating elements responsive to second monitor current by said differential amplifiers, said second monitor current flowing to said activating elements via resistors respectively connected in parallel with said switching devices when said switching devices are switched off;

calculating respective resistance values of said activating elements based on respective differential values between said amplified voltage values and said amplified second voltage values; and determining the presence or absence of the fault in said activating elements based on said respective resistance values.

6. A method of diagnosing a presence or absence of a failure of a plurality of activating elements formed by resistors for activating a passenger protection apparatus in correspondence to acceleration of a vehicle according to claim 5, further comprising the steps of:

detecting acceleration of a vehicle;

switching on all of said plurality of switching devices to supply activating current to said activating elements when acceleration equivalent to vehicle collision has been detected in said detecting step, said activating current causing said activating elements to activate said passenger protection apparatus.

* * * * *